United States Patent [19]

Jackson

[11] Patent Number: 4,584,758
[45] Date of Patent: Apr. 29, 1986

[54] CUT-CLINCH MECHANISM

[75] Inventor: Rodney P. Jackson, Auburn, N.H.

[73] Assignee: Emhart Corporation, Farmington, Conn.

[21] Appl. No.: 647,342

[22] Filed: Sep. 4, 1984

[51] Int. Cl.⁴ .............................................. B21F 1/00
[52] U.S. Cl. .................................... 29/566.3; 140/105
[58] Field of Search ............... 140/105; 29/566.3, 741, 29/566.1, 747

[56] References Cited

U.S. PATENT DOCUMENTS

| | | | |
|---|---|---|---|
| 3,593,404 | 7/1971 | Ragard | 29/566.1 |
| 3,769,864 | 11/1973 | Morse et al. | 83/516 |
| 4,036,092 | 7/1977 | Kaltenbach | 83/603 X |
| 4,095,511 | 6/1978 | Woolston | 83/499 X |
| 4,516,310 | 5/1985 | Bandura | 29/566.3 |

Primary Examiner—James M. Meister
Attorney, Agent, or Firm—Alan N. McCartney

[57] ABSTRACT

A mounting for a cut-clinch mechanism having separate elevator means for each head assembly for movement of the head assemblies on a vertical axis toward and away from a printed circuit board. The separate elevator means are carried on a common U-axis mounting that can move the head assemblies toward and away from one another to accommodate variably spaced component lead wires.

10 Claims, 5 Drawing Figures

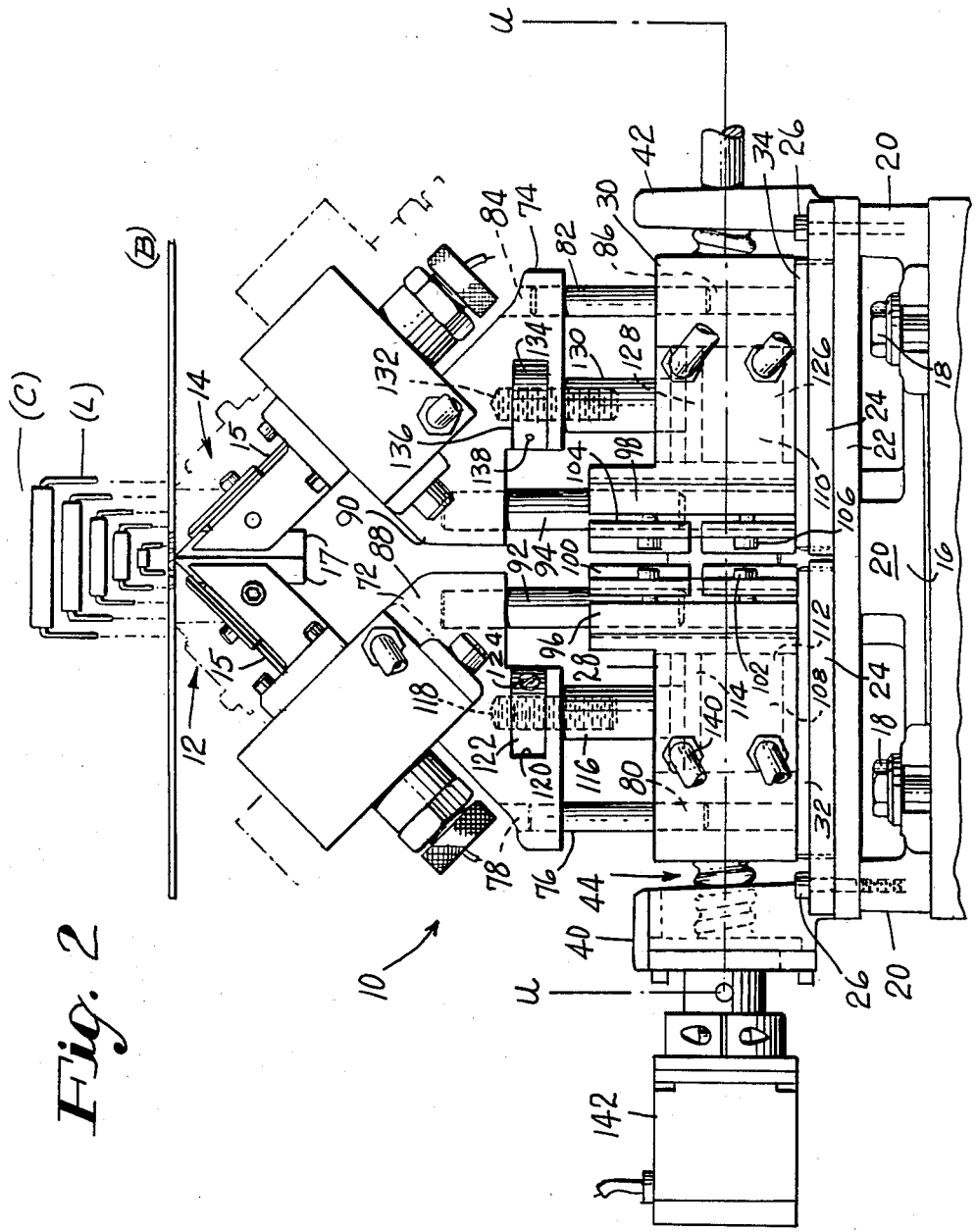

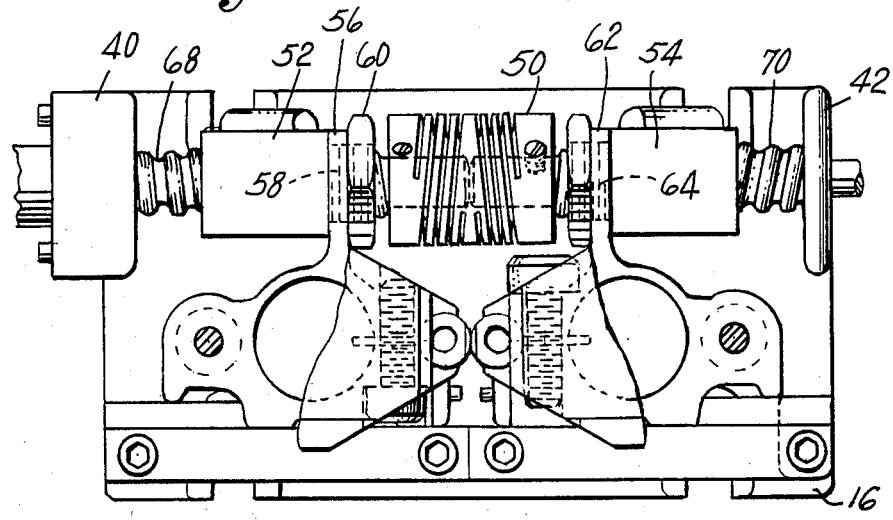
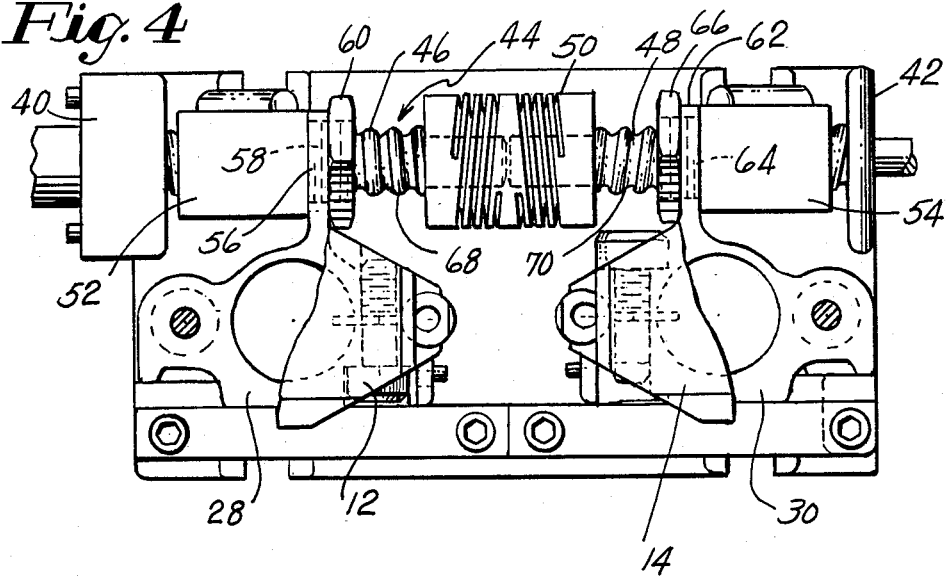

CUT-CLINCH MECHANISM

BACKGROUND OF THE INVENTION (1) Field of the Invention

An electrical component lead wire cutting and clinching mechanism.

(2) Summary of the Prior Art

In assembling axial lead components to printed circuit boards, the component lead wires are inserted down through predetermined openings in the board. Thereafter, a cut-clinch mechanism, located beneath the board, cuts off the excess lead wire and bends over or clinches the lead wire to the underside of the board to securely attach the component to the board. This permits the board to be handled during the remaining assembly operations prior to permanently attaching the components to the board as by wave soldering, for example.

In this lead wire cutting and clinching operation, a pair of opposed cut-clinch head assemblies are positioned so that the lead wires can be received between a pair of knives on each head assembly that cut and clinch the lead wire. In this operation, the head assembly is mounted on a mechanism for moving the head assembly toward and away from the board. This permits the cut-clinch operation to be performed with the head assembly in a raised position and in the lowered position, adequate clearance is provided for shifting movement of the board between successive operations.

In addition, it is desirable to have the opposed head assemblies mounted for movement toward and away from one another so that variable spaced leads of different lengths of components can be cut and clinched.

U.S. Pat. Nos. 3,429,170, 3,986,533, 4,153,082 and 4,288,914 illustrate various types of cut-clinch mechanisms that are adapted to cut off the component lead wire beneath the board and bend the lead wire to secure the component to the board. All of these prior art devices, however, have the head assemblies mounted on a common drive mechanism for vertical movement which maximizes the mass that must be moved vertically during the various sequential operations of the cut-clinch mechanism.

None of the prior art discloses using a common drive for varying the spacing between the opposed cut-clinch head assemblies and using separate drives for raising and lowering the head assemblies during the successive operations of the component insertion operation.

BRIEF SUMMARY OF THE INVENTION

It is an object of this invention to provide a cut-clinch mechanism for cutting and clinching the lead wires of electrical components that extend down through openings in a printed circuit board. The mechanism has opposed cut-clinch head assemblies which are mounted for movement toward and away from one another to accommodate variable center distance components. (The axis of this movement is known as the U-axis). This mounting includes a common ball screw drive mechanism which will vary the spacing between the cut-clinch head assemblies.

It is also a further object of this invention to provide a means to raise and lower the head assemblies so that the head assemblies are adjacent to the board during the cut-clinch operation and lowered away from the board to provide adequate clearance during the other operations performed on the board. The head assemblies are mounted on separate air cylinders to be moved separately but simultaneously toward and away from the board. This reduces the mass that each cylinder must accelerate up and down to the mass of each separate head assembly. This decreases the response time of the vertical movement of each head assembly and thus increases the speed of operation, i.e.: more cycles of the vertical movement phase per period of time. Also, by separately mounting the heads for vertical movement on a common U-axis, the U-axis is not moved at the time the head assemblies are raised and lowered during the successive operations of the component assembly machine upon which the cut-clinch mechanism is utilized.

It is a further object of this invention to provide a pair of cut-clinch head assemblies which are each mounted on a carrier for movement on a U-axis. The carriers are mounted on a guide rail and right and left hand threaded ball screws for movement toward and away from one another. Each carrier has an elevator upon which a head assembly is mounted for movement toward and away from a printed circuit board. This carrier-elevator has an air cylinder which vertically moves the head assembly, with the connection between the head assembly and carrier-elevator permitting finite adjustment of the head assembly height to accurately position the head assembly underneath the printed circuit board.

BRIEF DESCRIPTION OF THE DRAWINGS

FIG. 2 is a side elevational view similar to FIG. 1 illustrating the cut-clinch head assemblies in a raised position;

FIG. 3 is a top view showing the cut-clinch head assemblies adjusted to receive closely spaced lead wires of a component;

FIG. 4 is a top view showing cut-clinch head assemblies adjusted to receive wider spaced lead wires of a component.

DESCRIPTION OF THE PREFERRED EMBODIMENT

The cut-clinch mechanism of this invention is adapted to be mounted on a mechanism support below the surface of a printed circuit board. The mechanism has a pair of opposed cut-clinch head assemblies that have coacting knives adapted to cut and bend over the lead wires of axial lead components to secure the component to the board. The general environment for the application of the cut-clinch mechanism of this invention is illustrated in U.S. Pat. No. 4,080,730.

Figure 1:
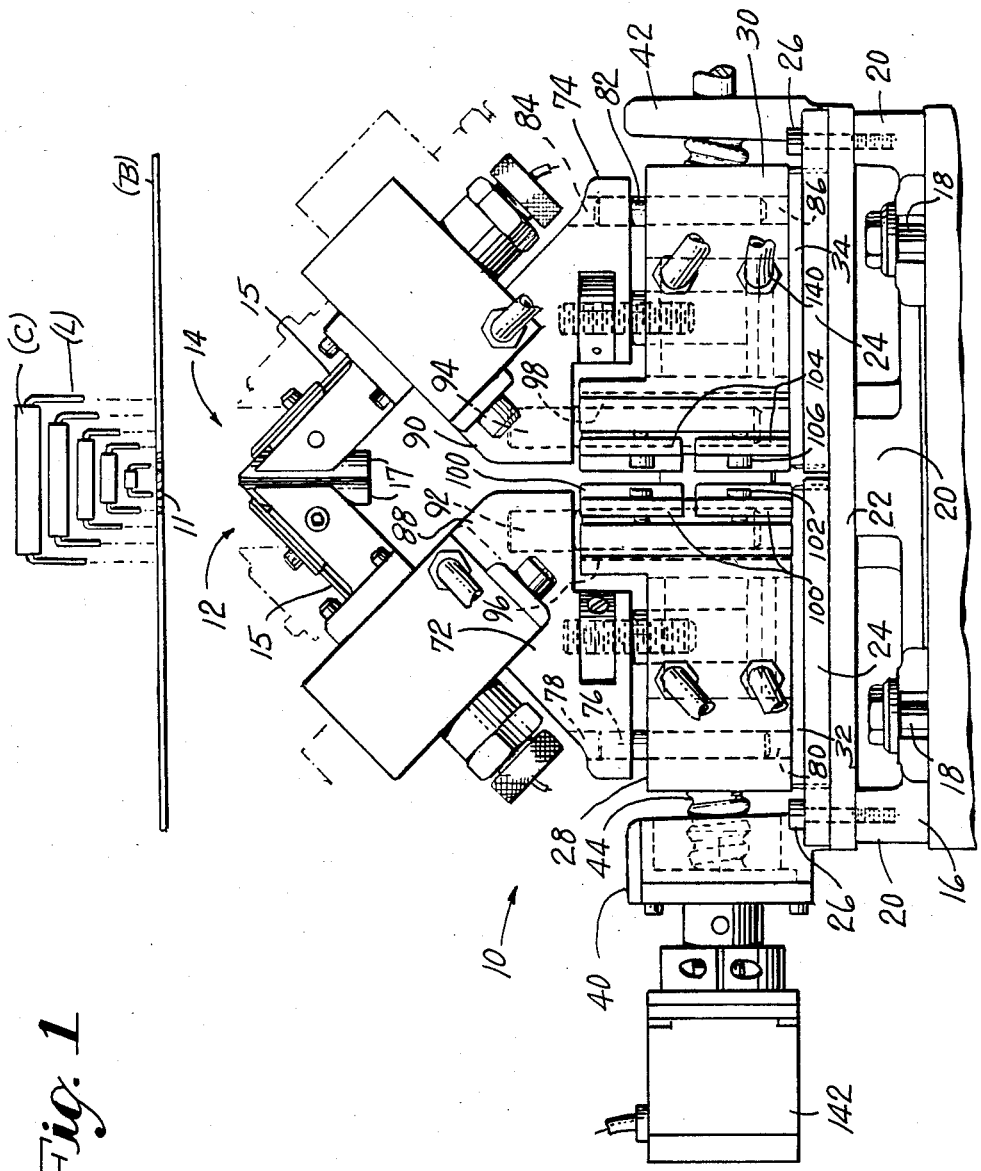
FIG. 1 is a side elevational view of the cut-clinch mechanism illustrating the mounting for the cut-clinch head assemblies.

Attention is now directed to FIGS. 1 and 2 which illustrate the cut-clinch mechanism 10 which is adapted to be mounted on a stationary machine support (not shown) below the surface of a printed circuit board (B). The mechanism 10 has a pair of cut-clinch head assemblies 12 and 14 which have knives 15 and 17 adapted to cut and clinch the lead wires (L) of the components (C) that would extend down through openings 11 in the board (B) to secure the component to the board, as is well known in the art. The head assemblies 12 and 14 are mounted on the mechanism 10 for movement toward the board for the cut-clinch operation (see FIG. 2) and away from the board (see FIG. 1) to provide clearance between the head assemblies and the board during other operations of the component assembly machine in which the mechanism is utilized. Additionally, the head assemblies are mounted on a U-axis (U) for movement toward and away from one another to cut and clinch the variable spaced leads (L) of the different lengths of components (C) that would be attached to the board (see FIGS. 1 and 2).

Figure 5:
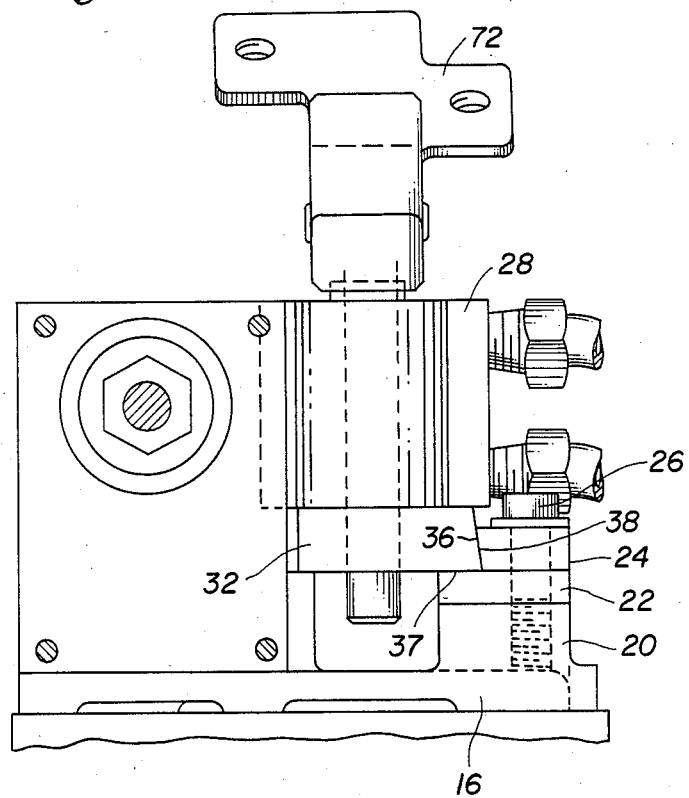
FIG. 5 is an end view of the mounting for the cut-clinch head assemblies which permits movement of the head assemblies on the U-axis.

The mechanism 10 comprises a base plate 16 adapted to be secured by bolts 18 to a stationary support (not shown) on the machine. Upwardly extending flanges 20 carry a hardened bearing support plate 22 and guide rails 24 which are secured thereto by bolts 26 (see FIG. 5). A pair of mounting blocks 28 and 30 have lower guide rails 32 and 34 which rest on the surface 37 of plate 22. Sloped faces 36 on rails 32 and 34 engage the sloped faces 38 on guide rails 24 (See FIG. 5). The mounting blocks 28 and 30 act as the carrier and elevator for the head assemblies 12 and 14, as will become apparent hereinafter.

Bearing blocks 40 and 42 on each end of the base plate 16 house a ball screw 44 comprising oppositely threaded shafts 46 and 48 interconnected by a flexible coupling 50. A ball nut 52 is carried on shaft 46 and ball nut 54 is carried on the shaft 48. The mounting block 28 has a flange 56 surrounding the threaded extension 58 of the ball nut 52. A lock nut 60 threaded on extension 58 attaches the flanges 56 to the ball nut 52. In like fashion, the mounting block 30 has a flange 62 surrounding the threaded extension 64 of the ball nut 54 and the lock nut 66 secured to extension 64 secures the flange 62 to the ball nut 54.

It can thus be seen that with the mounting blocks 28 and 30 being supported on rails 22 and with their flanges 56 and 62 carried on ball nuts 52 and 54, rotation of the ball screw 44 will separate or close the mounting blocks due to the opposite threads 68, 70 on the shafts 46, 48 respectively. In this fashion, the mounting blocks are carried on a stationary support for movement on a U-axis toward and away from one another.

Attention is now directed to FIGS. 1 and 2 which illustrate the mounting of the head assemblies 12 and 14 on the blocks 28 and 30 for movement toward and away from the board. The head assembly 12 is secured to bracket 72 and head assembly 14 is secured to bracket 74. An alignment pin 76 is positioned in opening 78 in bracket 72 and slides in opening 80 in mounting blocks 28. Likewise, alignment pin 82 is positioned in opening 84 in bracket 74 and slides in opening 86 in mounting block 30.

The forward portions 88, 90 of brackets 72, 74 each have guide pins 92, 94 slideable in bushings 96, 98 which are secured to the forward portions 88 and 90, respectively, of the brackets 72, 74. Clamps 100 bolted to the bracket 72 at 102 secure the bushing 96 to the bracket 72. Clamps 104 bolted to bracket 74 at 106 secure the bushing 98 to the bracket 74.

Each of the blocks 28, 30 have pneumatic cylinders 108, 110, respectively, which raise and lower the head assemblies (See FIGS. 1 and 2). The cylinder 108 comprises a cylindrical opening 112 receiving a piston 114 having a rod 116 positioned within the opening 118 in bracket 72. The bracket 72 has a slot 120 which has a locking collar 122. A set screw 124 on collar 122 acts against the piston rod 116 to lock piston rod 116 to the bracket 72. The collar 122 is threaded on the end of rod 116 to permit the bracket 72 to be raised or lowered with respect to block 28 to give a finite adjustment of the location of the head assembly with respect to the printed circuit board (B). Likewise, the cylinder 100 has an opening 126, a piston 128 and piston rod 130 received in opening 132 in bracket 74. The collar 134 is received in slot 136 in bracket 74 and is threaded on the end of rod 130 by a set screw 138. In the same manner as the mounting of bracket 72 on block 28, the collar 134 can be rotated to raise and lower the head assembly 14 for finite height adjustment to properly align the head assembly 14 with respect to the head assembly 12 and the board. In this fashion, small variations in the tolerance of the board thickness or other slight board imperfections can be accommodated. It should also be noted that the blocks 28 and 30 are provided with fittings 140 for the air lines to the cylinders 110, 112.

It can thus be seen that the device of this invention has two head assemblies mounted on a fixed center line for movement toward and away from one another to accommodate cutting and clinching the variably spaced component leads. By mounting the blocks 28 and 30 on a fixed center axis on a stationary support such as base plate 16, and by rotating the ball screw 44 by a stepping motor 142, for example (in response to a machine control), the head assemblies can be positioned depending upon the spacing of the lead wires of the particular component inserted into the board.

In view of the fact that the vertical drives of the head assemblies 12 and 14 are separately mounted on carrier boards 28 and 30, the mass each cylinder 110, 112 must raise and lower is reduced. Therefore, the time cycle of the raising and lowering of the head assemblies is decreased. Further, since the cylinders 110, 112 only have to raise the head assemblies and not also the U-axis mounting, (as in prior art devices), the center line of the U-axis mounting is not raised or lowered and thus disturbed during the sequences of the operation of the head assemblies. In this fashion, there is no load on the U-axis mounting when the head assemblies are raised and lowered. Additionally, with the interconnection of the collars 122 and 134 between the piston rods 116 and 130 and brackets 72 and 74, finite adjustment of the head assemblies is permitted.

It can, therefore, be appreciated that the cut-clinch head assembly mounting provides for the head assemblies to be carried on a fixed center line for U-axis spacing with such mounting supporting the elevating means for raising and lowering the head assemblies.

I claim:

1. A mounting for a cut-clinch mechanism for cutting and forming electrical component lead wires that extend through openings in a printed circuit board to secure the component to the board, comprising:
   a. a support base member;
   b. a pair of cut-clinch head assemblies adapted to receive the lead wires and cut and form the lead wires underneath the board;
   c. mounting means for positioning said head assemblies on said base member for movement of said head assemblies on a U-axis toward and away from one another to accommodate variable spacing of the component lead wires;
   d. support means carried on said mounting means for movement on a vertical axis toward and away from the board; and
   e. said support means including separate elevator means for each of said head assemblies to adjust the vertical spacing between each of said head assemblies and its mounting block.

2. The mounting of claim 1 wherein said mounting means includes a pair of carrier blocks each carried on a ball screw drive for movement of said carrier blocks toward and away from one another.

3. The mounting of claim 2, wherein said ball screw drive is actuated by a stepping motor.

4. The mounting of claim 2 wherein said elevator means includes a pneumatic cylinder interconnected to said support means to raise and lower said head assemblies.

5. The mounting of claim 4 wherein the interconnection between the mounting means and support means is adjustable to permit finite adjustment of the head assemblies with respect to the board.

6. A cut-clinch mechanism comprising:
   a. a pair of head assemblies each adapted to cut and clinch the lead wires of an axial lead component;
   b. means mounting said head assemblies for movement on a U-axis toward and away from one another to accommodate variable spaced component leads;
   c. means supporting each of said head assemblies separately on said mounting means to move said head assemblies on a vertical axis toward and away from said board;
   d. said mounting means including a pair of pneumatic cylinders supporting each of said support means accutable to raise and lower said head assemblies.

7. The cut-clinch mechanism of claim 6 wherein said support means includes adjustment means to separately adjust each of said head assemblies with respect to said mounting means.

8. The cut-clinch mechanism of claim 6 wherein said mounting means includes a carrier block for each of said head assemblies, each of said blocks being mounting on a ball screw drive to move said blocks on said U-axis.

9. The cut-clinch mechanism of claim 8 wherein said blocks are supported by a guide rail on one side thereof.

10. A cut-clinch mechanism for cutting and forming electrical component lead wires that extend down through openings in printed circuit boards, comprising:
   a. a base support member;
   b. a carrier including a pair of mounting blocks;
   c. means supporting said mounting blocks on said support member for movement on a U-axis toward and away from one another;
   d. a pair of cut-clinch head assemblies;
   e. elevator means supporting each of said head assemblies on one of said mounting blocks for movement toward and away from the board;
   f. each of said elevator means includes separate means to adjust the vertical spacing between each of said head assemblies and its mounting block.

* * * * *